United States Patent
Lee et al.

(10) Patent No.: US 7,403,027 B2
(45) Date of Patent: Jul. 22, 2008

(54) APPARATUSES AND METHODS FOR OUTPUTTING SIGNALS DURING SELF-HEAT BURN-IN MODES OF OPERATION

(75) Inventors: Yuen Tat Lee, Petaling Jaya (MY); Soon Eng Low, Penang (MY); Naveendran Balasingam, Kuala Lumpur (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/554,525

(22) Filed: Oct. 30, 2006

(65) Prior Publication Data

US 2008/0100327 A1    May 1, 2008

(51) Int. Cl.
*G01R 31/02* (2006.01)
*G01R 31/28* (2006.01)

(52) U.S. Cl. .................................... 324/763; 324/158.1

(58) Field of Classification Search ................. 324/763, 324/158.1
See application file for complete search history.

(56) References Cited

U.S. PATENT DOCUMENTS

| | | | | |
|---|---|---|---|---|
| 5,309,090 A | * | 5/1994 | Lipp | 324/158.1 |
| 5,570,374 A | * | 10/1996 | Yau et al. | 714/733 |
| 5,982,189 A | * | 11/1999 | Motika et al. | 324/763 |
| 6,816,814 B2 | * | 11/2004 | Ebert et al. | 702/182 |
| 6,981,191 B2 | * | 12/2005 | Dorsey | 714/733 |
| 6,996,760 B2 | * | 2/2006 | Dorsey | 714/733 |
| 7,233,161 B2 | * | 6/2007 | Zettler | 324/763 |
| 2005/0021260 A1 | * | 1/2005 | Robertson et al. | 702/75 |

* cited by examiner

*Primary Examiner*—Ha Nguyen
*Assistant Examiner*—Karen M Kusumakar
(74) *Attorney, Agent, or Firm*—Schwabe, Williamson & Wyatt, P.C.

(57) ABSTRACT

An apparatus and method for selecting and outputting test patterns and internal signals during various SHBI modes of operation. The apparatus may include multiple input/output (I/O) pins, one or more functional blocks, a Self-Heat Burn-In (SHBI) state machine that is coupled to the I/O pins and the one or more functional blocks, and a logic selector circuitry that is coupled to the SHBI state machine and the one or more functional blocks. The SHBI state machine may provide to the I/O pins with first one or more test patterns during a first SHBI mode of operation, and to provide the one or more functional blocks with second one or more test patterns during a second SHBI mode of operation. The logic selector circuitry is configured to select and output the first one or more test patterns to stress the I/O pins during the first SHBI mode of operation, and to select and output internal signals of the one more functional blocks during the second SHBI mode of operation.

20 Claims, 7 Drawing Sheets

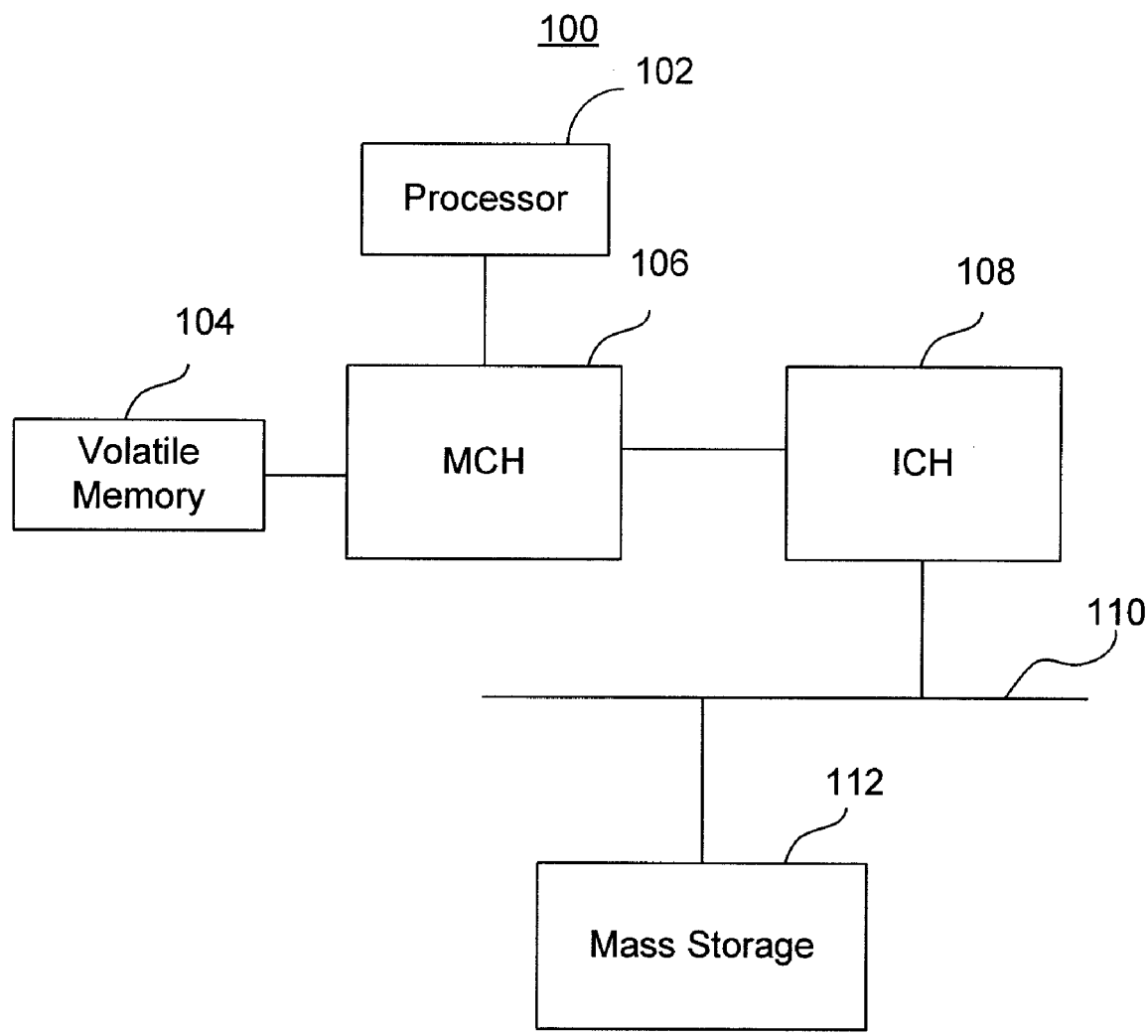

APPARATUSES AND METHODS FOR OUTPUTTING SIGNALS DURING SELF-HEAT BURN-IN MODES OF OPERATION

TECHNICAL FIELD

Embodiments of the present invention relate to the field of electronic device manufacturing, more specifically, to testing of electronic devices.

BACKGROUND

Integrated circuit devices such as processors, input/output controller hub (ICH), and so forth, are typically manufactured in the form of dice or "chips." During the manufacture or post manufacture of such devices, various testing operations may be performed on such devices.

For example, a burn-in operation may be performed to stress a device under test (DUT) in order to determine whether the DUT will fail under certain relatively extreme conditions such as at elevated temperatures and voltages. In some instances, such an operation may be performed by placing the DUT onto a burn-in board and coupling the DUT to drivers such that the DUT is run at relatively high voltage and temperature. In such operations, the temperature of the DUT can be elevated by toggling greater than 80% of the nodes of the DUT. Note that throughout the following description the terms "burn-in operation" and "high volume manufacturing (HVM) operation" will be used interchangeably and are, therefore, synonymous.

In contrast to a burn-in or HVM operation, a debug or debugging operation is performed in order to determine why an integrated circuit device is not behaving as designed or in accordance with simulation results. That is, any mismatch between silicon (i.e., circuit device embodied in a chip) and simulation may be best understood through the debugging process. A debugging operation is typically performed by providing predetermined signal patterns to various parts of the integrated circuit device and monitoring the internal signals of the device during the debugging operation.

In a conventional debugging operation, the DUT is placed onto an automated tester equipment (ATE) that probes the internal signals generated by the DUT during the debugging operation. However, before placing the DUT onto the ATE, engineering changes to the actual physical form of the DUT must first be performed. The engineering changes are typically accomplished by forming probe pads on the metal lines of the DUT. Once the engineering changes have been made, the DUT can be placed into the ATE. After placing the DUT on the ATE, probes that are coupled to an oscilloscope are coupled to the probe pads. Internal signals that are generated during the debugging operations may then be sampled through the probe pads. Unfortunately, performing conventional debugging operations tends to be expensive and can take up to weeks or even months to complete, depending on the complexity of the issue.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 7 illustrates a system in accordance with various embodiments of the present invention.

DETAILED DESCRIPTION OF ILLUSTRATIVE EMBODIMENTS OF THE INVENTION

Figure 1:
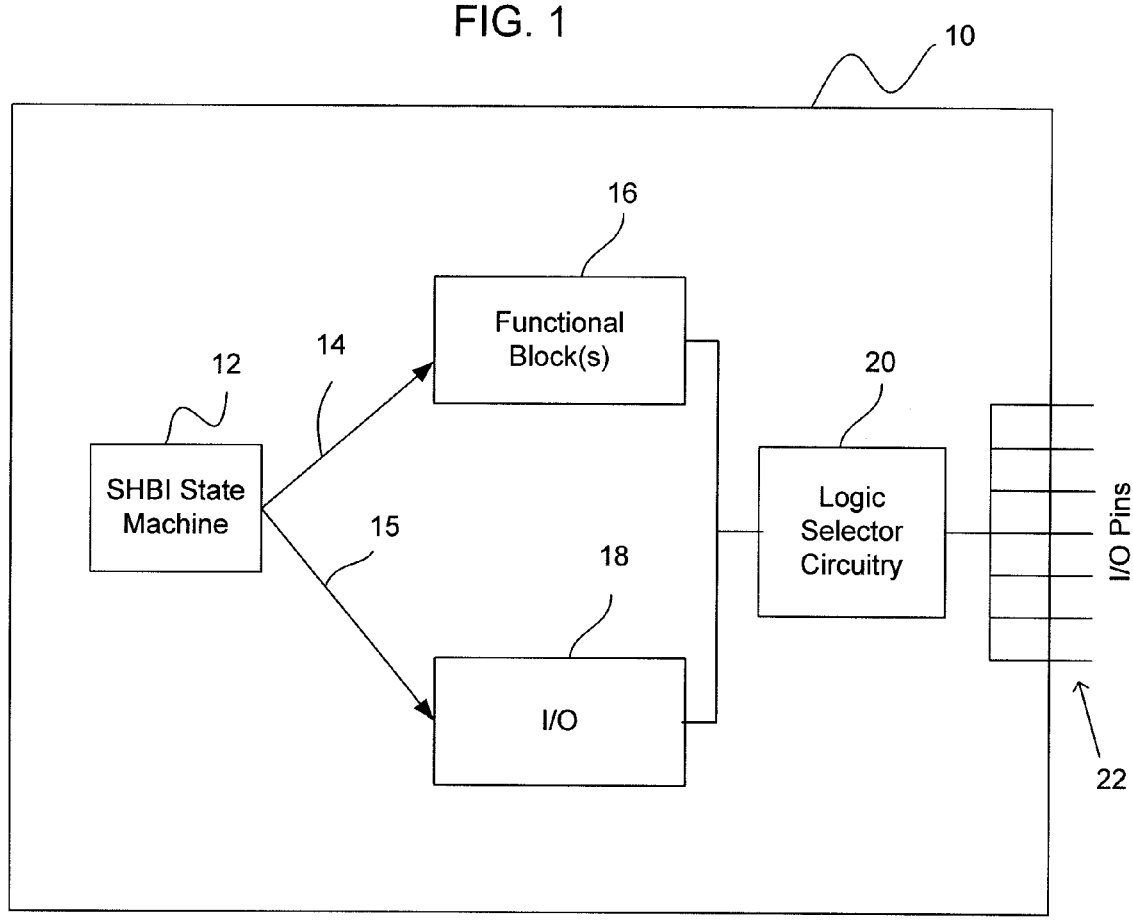
FIG. 1 illustrates a device in accordance with various embodiments of the present invention.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the instant description, the phrase "A/B" means A or B. For the purposes of the instant description, the phrase "A and/or B" means "(A), (B), or (A and B)." For the purposes of the instant description, the phrase "at least one of A, B and C" means "(A), (B), (C), (A and B), (A and C), (B and C) or (A, B and C)." For the purposes of the instant description, the phrase "(A)B" means "(B) or (AB)," that is, A is an optional element.

The description may use the phrases "in various embodiments," or "in some embodiments," which may each refer to one or more of the same or different embodiments. Furthermore, the terms "comprising," "including," "having," and the like, as used with respect to embodiments of the present invention, are synonymous.

According to various embodiments of the present invention, integrated circuit devices are provided that may operate in accordance with various Self-Heat Burn-In (SHBI) modes of operation without the need to place the devices into an ATE or the need to engineer the devices to include probe pads. In some embodiments, the various SHBI modes of operation may include, for example, an SHBI HVM mode of operation and an SHBI debug mode of operation. In some instances, the devices may be processors, ICH chipsets, or any other type of integrated circuit components that can be employed for performing burn-in operations including, for example, self-heat burn-in, conventional burn-in in oven, and so forth. For the embodiments, the devices may include, among other things, a plurality of input/output (I/O) pins, one or more functional blocks, an SHBI state machine coupled to the I/O pins and the one or more functional blocks, and a logic selector circuitry coupled to the SHBI state machine and the one or more functional blocks.

The SHBI state machine may be designed to provide the I/O pins with a first one or more test signal patterns (or simply "test patterns") during a first SHBI mode of operation, and to provide the one or more functional blocks with a second one or more test patterns during a second SHBI mode of operation. Correspondingly, the logic selector may be configured to select and output through the I/O pins the first one or more test patterns to stress the I/O pins during the first SHBI mode of operation, and to select and output through the I/O pins internal signals of the one or more functional blocks during the second SHBI mode of operation.

FIG. 1 depicts a device in accordance with various embodiments of the present invention. The device 10 may be a processor, an ICH, or other types of integrated circuit devices. The device 10 may include an SHBI state machine 12, one or more functional blocks 16, I/O block 18 representing I/O interfaces, logic selector circuitry 20, and I/O pins 22, coupled together as shown. For the embodiments, the device 10 may be configured to operate in various SHBI modes of operation including, for example, SHBI HVM mode of operation and SHBI debug mode of operation. When the device is operating in HVM mode, the SHBI state machine 12 may provide to the one or more functional blocks 16 and the I/O block 18 test signal patterns (or simply "test patterns") 14 and 15. As a result of providing the test patterns to the one or more functional blocks 16, internal signals may be generated by the one or more functional blocks 16. However, the logic selector circuitry 20 may select and output to the I/O pins 22 only the test patterns provided to the I/O block 18 and not select and output any internal signals generated by the one or more functional blocks 16.

In contrast, when the device 10 is operating in a debug mode, the SHBI state machine 12 may generate again the test patterns 14 and 15 or selected test patterns to toggle the one or more functional blocks 16 and the I/O block 18. As a result of the test patterns 14 provided to the one or more functional blocks 16, internal signals may be generated. The logic selector circuitry 20 may then, and in contrast to when the device 10 is operating in HVM mode, select and output to at least some of the I/O pins 22 internal signals provided by the one or more functional blocks 16. By outputting the internal signals provided by the one or more functional blocks 16 through at least some of the I/O pins 22, debugging operations may be performed while the device 10 is coupled to, for example, a burn-in board without the need to engineer the device to include probe pads or placing the device in a ATE. The internal signals outputted through the I/O pins 22 may then be monitored using, for example, an oscilloscope.

Figure 2:
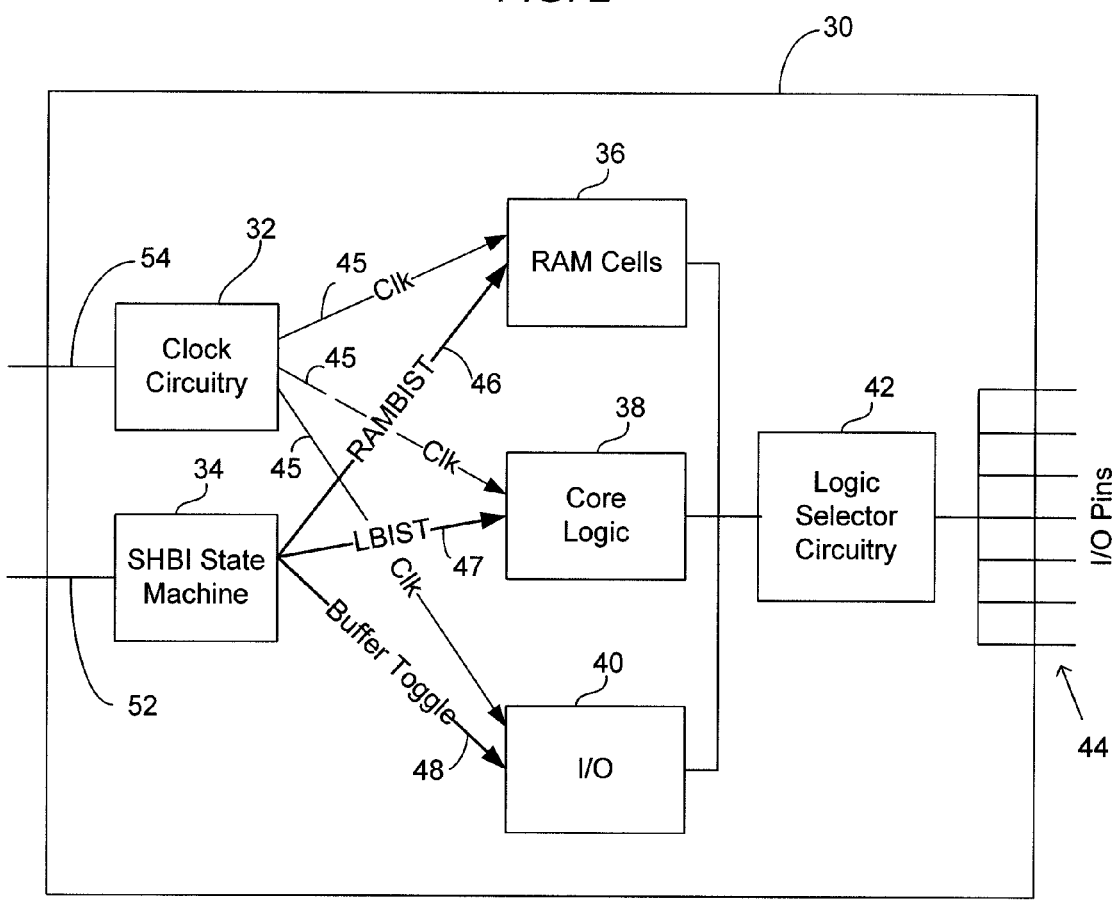
FIG. 2 illustrates another device in accordance with various embodiments of the present invention.

FIG. 2 depicts a device in accordance with various embodiments of the present invention. In some embodiments, the device 30 may be an ICH chipset. The device 30 includes a clock circuitry 32, an SHBI state machine 34, functional blocks including random access memory (RAM) cells 36 and core logic 38, I/O block 40, logic selector circuitry 42, and I/O pins 44, coupled together as shown. In various embodiments, the clock circuitry 32 may provide to the RAM cells 36, the core logic 38, and the I/O block 40, clock signals 45. In some embodiments, and as will be described in greater detail below, the clock circuitry 32 may throttle the clock signals 45 according to different throttling schemes or provide fixed frequency clock signals 45 depending upon whether, for example, the device 30 is operating an HVM mode or debug mode.

The SHBI state machine 34 may provide various test patterns including RAM built-in self-test (BIST) or RAMBIST 46, logic BIST (LBIST) 47, and Buffer Toggle 48 to the RAM cells 36, the core logic 38, and the I/O block 40 during various SHBI modes of operations (e.g., HVM and debug modes of operations). For example, during an HVM mode of operation, the SHBI state machine 34 may provide test patterns including RAMBIST 46, LBIST 47, and Buffer Toggle 48 to the RAM cells 36, the core logic 38, and the I/O block 40, respectively. During the HVM operation, the logic selector circuitry 42 may be configured to select and output to the I/O pins 44 only the Buffer Toggle 48 to stress the I/O pins 44. Thus, although internal signals may be generated by the RAM cells 36 and the core logic 38, such signals may not be selected to be outputted through the I/O pins 44 during the HVM operation.

In contrast, during a debug operation, the SHBI state machine 34 may provide only selected test patterns (i.e., RAMBIST 46, LBIST 47, and/or Buffer Toggle 48) to the RAM cells 36, the core logic 38, and/or the I/O block 40, respectfully. Further, the logic selector circuitry 42 may select and output to at least some of the I/O pins 44 internal signals of the RAM cells 36 and/or core logic 38. Inputs 54 and 52 may be provided to the clock circuitry 32 and the SHBI state machine 34 in order to control the clock circuitry 32, the SHBI state machine 34, and the logic selector circuitry 42 during various SHBI modes of operation as will be described in greater detail below.

Figure 3:
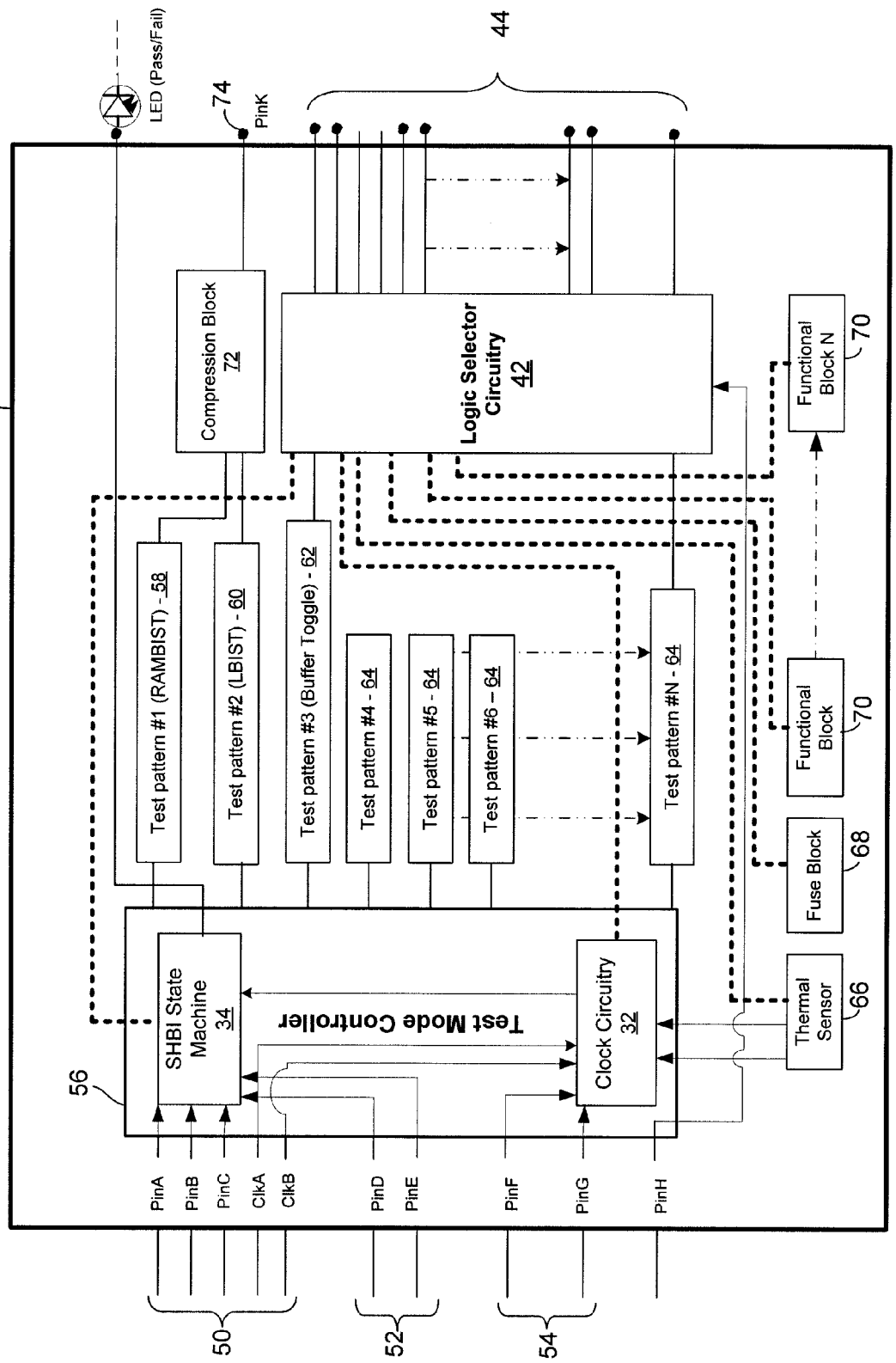
FIG. 3 illustrates the device of FIG. 2, in further detail, in accordance with various embodiments of the present invention.

FIG. 3 depicts the device of FIG. 2 in greater detail in accordance with various embodiments of the present invention. As illustrated, the SHBI state machine 34 and the clock circuitry 32 may be part of a test mode controller 56. On the left side of the device 30 are a first set of inputs 50 (i.e., PinA, PinB, PinC, ClkA, and ClkB), a second set of inputs 52 (i.e., PinD and PinE), and a third set of inputs 54 (i.e., PinF and PinG). Note that in various embodiments, one or more of the inputs 50, 52, and 54 may be via, for example, strap pins. The first set of inputs 50 may be provided by drivers of, for example, a burn-in board. For example, in one conventional burn-in board, each device under test (DUT) to be coupled to the burn-in board may each be coupled to five drivers. As depicted, PinA, PinB, and PinC may be for driving the SHBI state machine 34. ClkA and ClkB may be for providing clocks to the clock circuitry 32.

The second set of inputs 52 may be for facilitating selection of the SHBI modes of operations (e.g., RAMBIST, LBIST, and/or Buffer Toggle modes of operations). In particular, the second set of inputs 52 may be used to control the SHBI state machine 34 to output various types of test patterns for the various SHBI modes of operation. Pin H may also control the logic selector circuitry 42 directly or indirectly such that the logic selector circuitry 42 is configured to, during HVM operations for example, select and output to the I/O pins 44 only buffer toggle, and to during debug operations, select and output to at least some of the I/O pins 44 internal signals of functional blocks 70 (i.e., RAM cells, core logic, and so forth). Note that during a debug operation the logic selector circuitry 42 may also be configured to, in addition to selecting and outputting the internal signals, select and output to one or more of the I/O pins 44, data signals from a thermal sensor 66, a fuse block 68, the clock circuitry 32, and the SHBI state machine 34.

The clock circuitry 32 may provide clock signals to various components of the device 30 including the functional blocks 70 during various SHBI modes of operation. The clock circuitry 32 may be coupled to the thermal sensor 66 that provides to the clock circuitry 32, signals that indicate the thermal conditions of the device 30. Such signals may be used to facilitate the clock throttling that may be performed by the clock circuitry 32 during, for example, HVM operations.

Included in the device 30 are multiple test pattern modules 58 to 64 to generate various test patterns. Thus, when the device 30 is operating in a particular SHBI mode of operation (e.g., HVM mode or debug mode of operation), the SHBI state machine 34 may prompt or initiate all or selective test pattern modules 58 to 64 to generate test patterns that may be needed for that particular SHBI operation. As depicted, test pattern #1 module 58 may generate RAMBIST, test pattern #2 module 60 may generate LBIST, test pattern #3 module 62 may generate Buffer Toggle, and the other test pattern modules 64 may generate other test patterns. Note that although not depicted, the test patterns generated by the test pattern modules 58 and 60 may be provided to the functional blocks 70 (e.g., RAM cells and the core logic) in order to facilitate various SHBI modes of operation. The test patterns provided by the test pattern modules 58 and 60 may also be provided to a compression block 72, which compresses the signals provided by the test pattern modules 58 and 60 and outputs the compressed signals, serially, through PinK 74.

The logic selector circuitry 42 may select and output to the plurality of I/O pins 42, selected ones of Buffer Toggle from test pattern #3 module 62, internal signals of the functional blocks 70 (e.g., core logic and RAM cells), data signals from the SHBI state machine 34, data signals from the clock circuitry 32, data signals from the thermal sensor 66, data signals from the fuse block 68, depending upon which SHBI mode of operation is the device 30 operating under. For example, when the device 30 is operating in an HVM mode, the logic selector circuitry 42 may select and output to the I/O pins 44 only the Buffer Toggle from the test pattern #3 module 62. In contrast, when the device 30 is operating in a debug mode, the logic selector circuitry 42 may select and output to at least some of the I/O pins 44, internal signals of the functional blocks 70 (e.g., RAM cells and core logic) and/or data signals from the SHBI state machine 34, the clock circuitry 32, thermal sensor 66, and/or the fuse block 68. It should be noted that although the I/O pins 44 are described as "pins," the I/O pins 44 may in fact be any type of conductive contacts including, for example, conductive pads.

Figure 4:
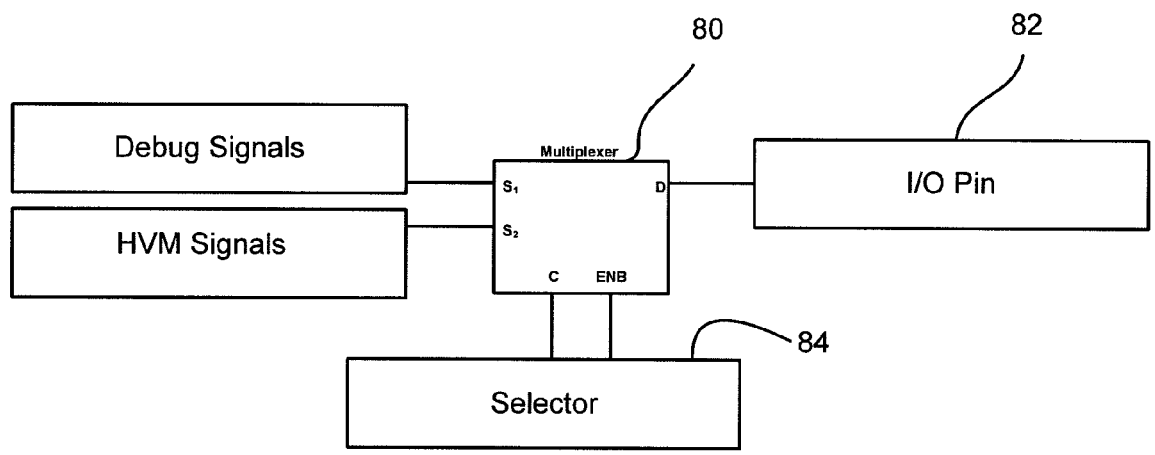
FIG. 4 illustrates a multiplexer and a selector block in accordance with various embodiments of the present invention.

The logic selector circuitry 42 may include a plurality of multiplexers and one or more selector blocks. FIG. 4 depicts one such multiplexer 80 coupled to a selector block 84 in accordance with various embodiments of the present invention. As further shown, the multiplexer 80 is also coupled to an I/O pin 82, which may be one of the I/O pins 44 of FIG. 3. The selector block 84 may receive input from Pin H (see FIG. 3) or alternatively from the SHBI state machine 34. The selector block 84 may control the multiplexer 80 to configure the multiplexer 80 to select and output to the I/O pin 82 either debug signals (i.e., internal signals of a functional block) or HVM signals (i.e., Buffer Toggle). Alternatively, the selector block 84 may control the multiplexer 80 to configure the multiplexer 80 to select and output to the I/O pin 82 either HVM signals or data signals from the SHBI state machine 34, the clock circuitry 32, the thermal sensor 66 or the fuse block 68.

Figure 5:
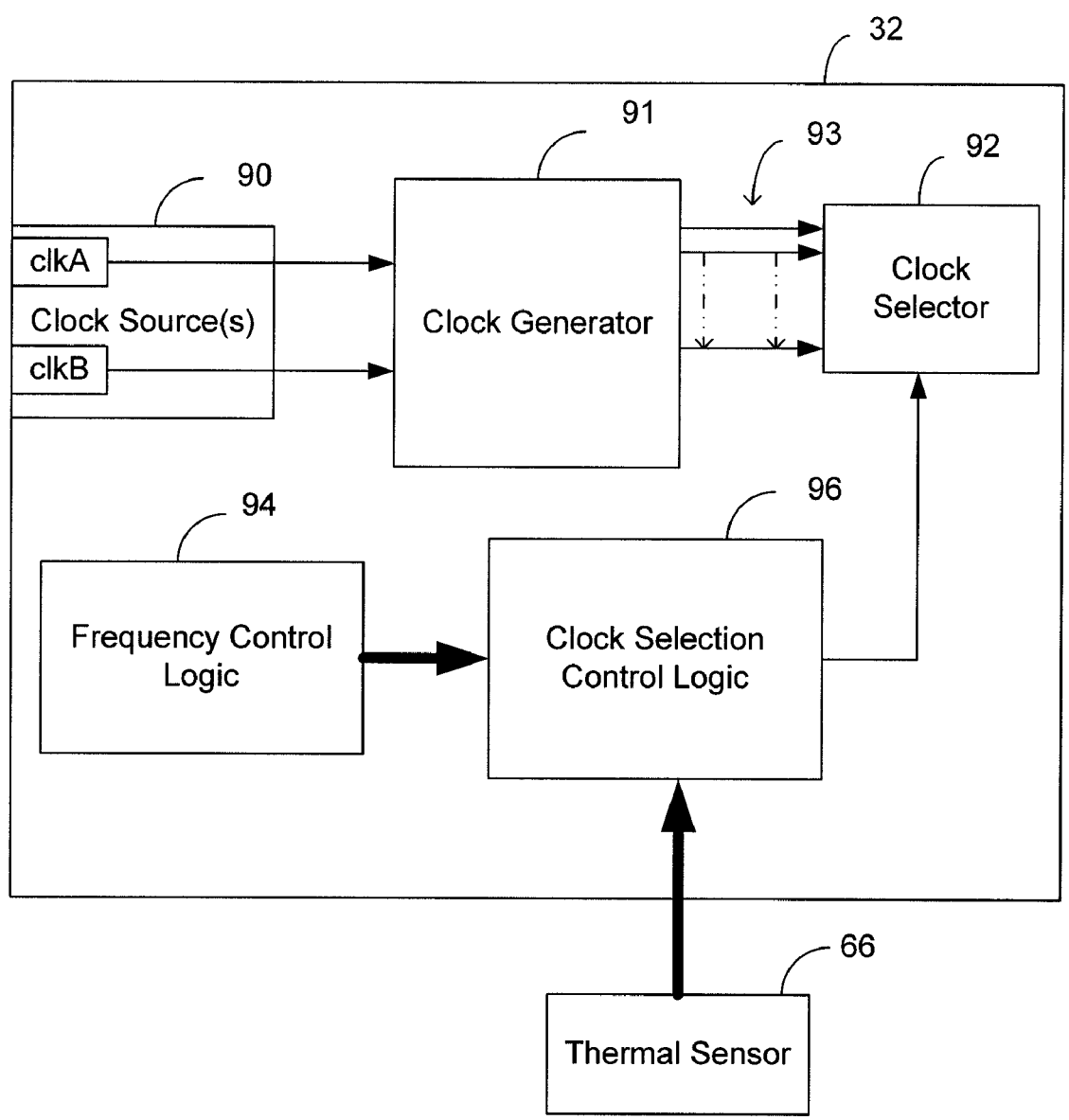
FIG. 5 illustrates the clock circuitry of FIG. 3 in accordance with various embodiments of the present invention.

FIG. 5 depicts the clock circuitry 32 of FIG. 3 in accordance with various embodiments of the present invention. The clock circuitry 32, for the embodiments, may provide a plurality of clock signals to one or more of the functional blocks 70, and to throttle the clock signals during a first SHBI mode of operation, and to provide single frequency block signals to the one or more of the functional blocks 70 during a second SHBI mode of operation. In some embodiments, the first SHBI mode of operation may be an SHBI HVM mode of operation while the second mode of operation may be an SHBI debug mode of operation. The clock circuitry 32 when throttling clock signals to be provided to the one or more functional blocks 70 may selectively throttle the clock signals according to different throttling schemes (e.g., 40 ←→ 20 ←→ 2 ←→ 0 MHz or 40 ←→ 2 ←→ 0 MHz). These and other features of the clock circuitry 32 may better facilitate the execution of various SHBI modes of operations.

The clock circuitry 32 includes clock source(s) 90, a clock generator block 91, a clock selector block 92, a frequency control logic 94, and a clock selection control logic 96, coupled together as shown. For the embodiments, the clock source 90 may feed clocks (either internal or external) into the clock generator block 91. The clock generator block 91 may then take the various input clocks and generate all required clocks (see reference 93) needed for, for example, an SHBI mode of operation. The frequency control logic 94 may work with the clock selection control logic 96 to allow it to reach a required amount of time before making a different clock selection mode. The clock selection control logic 96 may use the inputs from the frequency control logic 94 and input from the thermal sensor 66 to provide control signals that will enable clock selector block 92 to select the required clock needed for a given SHBI mode of operation (e.g., HVM or debug modes of operation).

Figure 6:
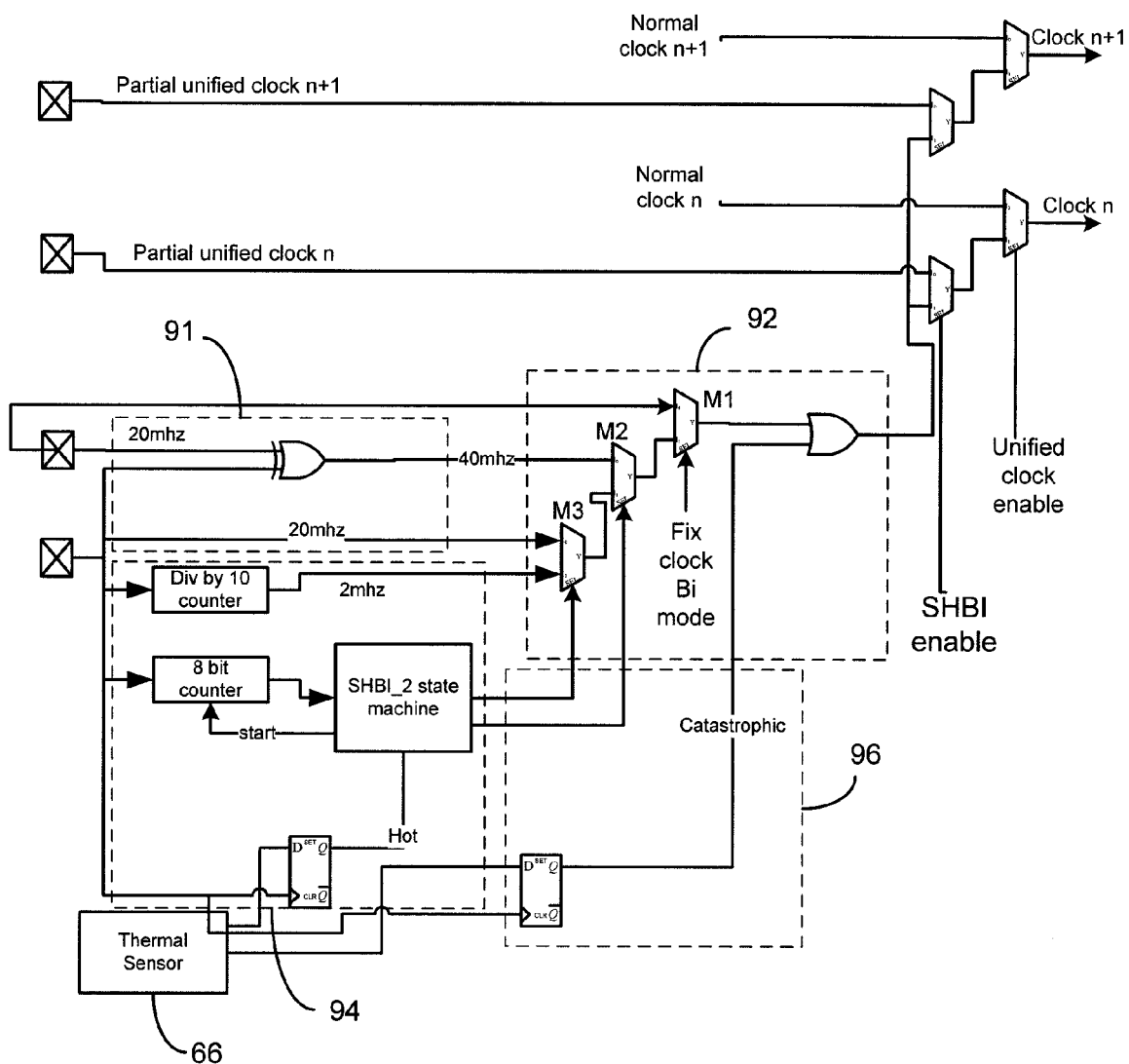
FIG. 6 illustrates the clock circuitry of FIG. 5, in further detail, in accordance with various embodiments of the present invention.

FIG. 6 depicts the clock circuitry of FIG. 5, in greater detail, in accordance with various embodiments of the present invention. The four dotted overlying squares represents the clock generator block 91, the clock selector block 92, the frequency control logic 94, and the clock selection control logic 96 depicted in FIG. 5. Note in particular that the clock selector block 92 includes three multiplexers (M1, M2, and M3), where M2 and M3 together provide different throttling clock frequencies (i.e., 2 MHz, 20 MHz, and 40 MHz), while M1 is used to disable the throttling in order for the clock circuitry to provide a fixed clock (i.e., a single frequency clock of 20 MHz).

Referring now to FIG. 7 depicting a system 100 in accordance with various embodiments of the present invention. The system 100 includes a processor 102, volatile memory 104, memory controller hub (MCH) 106, an ICH 108, bus(es) 110, and a mass storage device 112, coupled together as shown. Stored in the mass storage device 112 may be an operating system. For the embodiments, one or more of the components of the system 100 may include the logic selector circuitry 42 and/or clock circuitry 32 described previously.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
   a plurality of input/output (I/O) pins;
   one or more functional blocks;
   a Self-Heat Burn-In (SHBI) state machine coupled to the I/O pins and to the one or more functional blocks to provide the I/O pins with a first portion of first test patterns and to provide the one or more functional blocks with a second portion of the first test patterns during a first SHBI mode of operation, and to provide the one or more functional blocks with at least a portion of second test patterns during a second SHBI mode of operation; and a logic selector circuitry coupled to the SHBI state machine and the one or more functional blocks, and configured to select and output to the I/O pins the first portion of the first test patterns to stress the I/O pins without selecting and outputting to the I/O pins internal signals of the one or more functional blocks during the first SHBI mode of operation, and to select and output to the I/O pins internal signals of the one or more functional blocks during the second SHBI mode of operation.

2. The apparatus of claim 1, wherein the first SHBI mode is an SHBI high volume manufacturing (HVM) mode.

3. The apparatus of claim 1, wherein the second SHBI mode is SHBI debug mode.

4. The apparatus of claim 1, further comprising a strap pin to facilitate selection of the SHBI modes of operations.

5. The apparatus of claim 1, wherein the one or more functional blocks comprise random access memory (RAM) cells and core logic, and the SHBI state machine is configured to provide RAM Built-In Self-Test (RAMBIST) test patterns to the RAM cells and/or Logic Built-In Self-Test (LBIST) test patterns to the core logic during said SHBI modes of operation.

6. The apparatus of claim 1, wherein the SHBI state machine is configured to provide Buffer Toggle test patterns to the I/O pins during at least said first SHBI mode of operation.

7. The apparatus of claim 1, further comprising a thermal sensor and/or a fuse block, and said logic selector circuitry is further adapted to select and output data signals from the thermal sensor and/or fuse block to one or more of the I/O pins during said second SHBI mode of operation.

8. The apparatus of claim 1, further comprising:
a clock circuitry coupled to the functional blocks to provide a plurality of clock signals to the one or more functional blocks, and throttle the clock signals, during the first SHBI mode of operation, and to provide a single frequency clock signal to the one or more functional blocks during the second SHBI mode of operation without varying the clock frequency during the second SHBI mode of operation.

9. The apparatus of claim 8, wherein said clock circuitry is configurable to throttle the clock signals according to different throttling schemes during the first SHBI mode of operation.

10. The apparatus of claim 8, further comprising a thermal sensor coupled to the clock circuitry to provide signals to the clock circuitry indicating thermal conditions of the apparatus to facilitate said throttling.

11. A method, comprising:
providing a first portion of first test patterns to a plurality of input/output (I/O) pins and a second portion of the first test patterns to one or more functional blocks during a first Self-Heat Burn-In (SHBI) mode of operation, and providing at least a portion of second test patterns to one or more functional blocks during a second SHBI mode of operation; and selecting and outputting to the I/O pins the first portion of the first test patterns to stress the I/O pins without selecting and outputting to the I/O pins internal signals of the one or more functional blocks during the first SHBI mode of operation, and selecting and outputting to the I/O pins internal signals of the one or more functional blocks during the second SHBI mode of operation.

12. The method of claim 11, wherein the first SHBI mode is an SHBI high volume manufacturing (HVM) mode and the second SHBI mode is SHBI debug mode.

13. The method of claim 11, providing a single frequency clock signal to the one or more functional blocks during the second SHBI mode of operation without varying the clock frequency during the second SHBI mode of operation.

14. The method of claim 11, wherein the one or more functional blocks comprise random access memory (RAM) cells and core logic, and said providing first and second test patterns comprises providing RAM Built-In Self-Test (RAMBIST) test patterns to the RAM cells and/or Logic Built-In Self-Test (LBIST) test patterns to the core logic during said SHBI modes of operation.

15. The method of claim 14, further comprising Buffer Toggle test patterns to the I/O pins during at least said first SHBI mode of operation.

16. The method of claim 11, further comprising selecting and outputting data signals from a thermal sensor and/or fuse block to one or more of the I/O pins during said second SHBI mode of operation.

17. The method of claim 11, further comprising selecting and outputting data signals from a clock circuitry to one or more of the I/O pins during said second SHBI mode of operation.

18. A system, comprising:
a mass storage device having an operating system therein;
an apparatus coupled to the mass storage device, the apparatus including:
a plurality of input/output (I/O) pins;
one or more functional blocks;
a Self-heat Burn-In (SHBI) state machine coupled to the I/O pins and to the one or more functional blocks to provide the I/O pins with a first portion of first test patterns and to provide the one or more functional blocks with a second portion of the first test patterns during a first SHBI mode of operation, and to provide the one or more functional blocks with at least a portion of second test patterns during a second SHBI mode of operation; and
a logic selector circuitry coupled to the SHBI state machine and the one or more functional blocks, and configured to select and output to the I/O pins the first portion of the first test patterns to stress the I/O pins without selecting and outputting to the I/O pins internal signals of the one or more functional blocks during the first SHBI mode of operation, and to select and output to the I/O pins internal signals of the one or more functional blocks during the second SHBI mode of operation.

19. The system of claim 18, wherein said apparatus is an I/O controller hub (ICH).

20. The system of claim 19, wherein said apparatus is a processor.

* * * * *